US007348531B2

(12) United States Patent
Okuda et al.

(10) Patent No.: US 7,348,531 B2
(45) Date of Patent: Mar. 25, 2008

(54) PHOTOELECTRIC CONVERSION DEVICE AND IMAGE PICKUP DEVICE USING ELECTRON EMISSION DEVICES

(75) Inventors: Yoshiyuki Okuda, Tsurugashima (JP); Saburo Aso, Koufu (JP); Katsumi Yoshizawa, Koufu (JP); Takamasa Yoshikawa, Tsurugashima (JP); Hideo Satoh, Tsurugashima (JP); Nobuyasu Negishi, Tsurugashima (JP); Kazuto Sakemura, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 120 days.

(21) Appl. No.: 11/053,202

(22) Filed: Feb. 9, 2005

(65) Prior Publication Data

US 2005/0184220 A1 Aug. 25, 2005

(30) Foreign Application Priority Data

Feb. 12, 2004 (JP) ............................ 2004-034942

(51) Int. Cl.

*H01L 27/00* (2006.01)
*H01L 31/00* (2006.01)
*H01L 29/06* (2006.01)
*G09G 3/20* (2006.01)
*H01J 9/02* (2006.01)

(52) U.S. Cl. .............................. 250/208.1; 250/214.1; 257/10; 345/74.1; 313/310

(58) Field of Classification Search ............ 250/214 R, 250/214.1, 208.1; 257/10, 13, 32, 36, 37; 345/74.1; 348/216.1; 313/310, 336, 496; 438/20

See application file for complete search history.

(56) References Cited

U.S. PATENT DOCUMENTS

| | | | | |
|---|---|---|---|---|
| 5,488,386 | A * | 1/1996 | Yamagishi et al. | 345/74.1 |
| 5,936,257 | A * | 8/1999 | Kusunoki et al. | 257/10 |
| 6,316,873 | B1 * | 11/2001 | Ito et al. | 313/496 |
| 6,559,818 | B1 * | 5/2003 | Browning | 345/74.1 |
| 6,720,996 | B1 * | 4/2004 | Suyama et al. | 348/216.1 |
| 2003/0048745 | A1 * | 3/2003 | Yoshikawa et al. | 369/292 |

FOREIGN PATENT DOCUMENTS

| | | |
|---|---|---|
| DE | 44 45 894 A1 | 6/1996 |
| EP | 0 600 476 A | 6/1994 |

(Continued)

OTHER PUBLICATIONS

European Search Report dated Jun. 15, 2005.

*Primary Examiner*—Georgia Epps
*Assistant Examiner*—Don Williams
(74) *Attorney, Agent, or Firm*—McGinn IP Law Group, PLLC

(57) ABSTRACT

Disclosed is an image pickup device capable of greatly reducing delay in drive signals supplied to field emission devices, and cross-talk and the like that originate in these drive signals. The image pickup device comprises a photoelectric conversion film for receiving incident light on one side thereof; a field emission layer having an electron emitting surface apart from and facing the other side of the photoelectric conversion film, and including a plurality of electron emission devices; and a drive layer formed on a back side of the field emission layer and including a plurality of device drive circuits for supplying drive signals to each of back electrodes of the plurality of electron emission devices.

19 Claims, 9 Drawing Sheets

FOREIGN PATENT DOCUMENTS

| | | | |
|---|---|---|---|
| EP | 0 797 233 | A | 9/1997 |
| EP | 1 048 939 | A | 11/2000 |
| EP | 1 117 117 | A | 7/2001 |
| JP | 2000-48743 | | 2/2000 |
| JP | 2001-196017 | | 7/2001 |

* cited by examiner

PHOTOELECTRIC CONVERSION DEVICE AND IMAGE PICKUP DEVICE USING ELECTRON EMISSION DEVICES

BACKGROUND OF THE INVENTION

1. Field of the Invention

The present invention relates to a photoelectric conversion device and an image pickup device that perform photoelectric conversion and use a field emission type electron source.

2. Description of the Related Art

Application of a strong electric field to a solid surface lowers a potential barrier and reduces the width of the potential barrier of the solid surface confining the electrons within the solid, so that electrons (cold electrons) are emitted by a tunneling effect. This phenomenon is called the field emission. Field emission devices (FEDs) known are Spindt-type devices, surface conduction electron emitters (SCEs), devices having a metal-insulator-metal (MIM) structure or metal-insulator-semiconductor (MIS) structure, and so forth. Of these, Spindt-type devices each having a conical cold cathode are the most widely known.

Development of image pickup devices using the field emission devices has been underway in recent years. For instance, Japanese Patent Kokai No. 2000-48743 discloses an image pickup device using Spindt-type devices. FIG. 1 is a cross section schematically illustrating a structure of an image pickup device 100 disclosed in Japanese Patent Kokai No. 2000-48743. Referring to FIG. 1, the image pickup device 100 has a vacuum vessel 102 consisting of a cathode substrate (glass substrate) 101, a transparent substrate 103 and spacers 104A and 104B. Field emission devices 111 and a photoelectric conversion target 120 are disposed within this vacuum vessel 102. The photoelectric conversion target 120 includes a conductor film 121 and a photoelectric conversion film 122 which is formed on the back side of the transparent substrate 103. The field emission devices 111 each have a cathode conductor 113, a conical emitter (cold cathode) formed on this cathode conductor 113, and a gate electrode 112. The distal ends of the emitters 114 are exposed through openings formed in the gate electrodes 112, and face the photoelectric conversion target 120. A mesh electrode (sealed grid electrode) 110 is disposed between the photoelectric conversion film 122 and the field emission devices 111. When a high voltage is applied to the gate electrodes 112, electron beams are emitted from the distal ends of the emitters 114 by the above-mentioned field emission, and these beams pass through holes in the mesh electrode 110 and reach the photoelectric conversion film 122.

The photoelectric conversion film 122 is a film containing a sensitizer, and is under the application of a strong electric field. Incident light on the photoelectric conversion film 122 generates electron-hole pairs within the film, resulting in an avalanche phenomenon that amplifies the holes. When these holes recombine with the electrons arriving from the field emission devices 111, current flows so as to replenish the electrons annihilated via the recombination, so the amount of incident light on the photoelectric conversion film 122 can be measured by detecting this current.

The emitters 114 of the field emission devices 111 are arranged in a matrix, and the field emission devices 111 are driven in a dot sequential manner for every pixel. The reason for driving the field emission devices 111 in a dot sequential manner is that since the photoelectric conversion film 122 is a continuous film, we do not know which pixel the detected signal corresponds to when two electron beams are emitted simultaneously from emitters 114 whose pixel positions are apart from each other. In general, the higher is the resolution of the image pickup device 100, the more pixels there are, so when the field emission devices 111 are driven dot-sequentially, a drive time per pixel ends up being extremely short. For example, in the case of VGA specification, a resolution of the image pickup device 100 is 640×480 pixels. To scan all of the pixels in one frame within 1/30 of a second, the drive time per pixel has to be an extremely short time of only about 100 nanoseconds.

However, with the above-mentioned image pickup device 100, because drive circuits 106A and 106B that drive the field emission devices 111 are disposed on a cathode substrate 101 in parallel with the field emission devices 111, there are many signal lines connecting the drive circuits 106A and 106B and the field emission devices 111. This tends to generate cross-talk between the signal lines and delay the drive signals transmitted along the signal lines. Since the drive time per pixel is extremely short, as mentioned above, a delay in the drive signals is a problem in that dot-sequential scanning cannot be accurately executed.

Furthermore, high-frequency drive signals outputted from the drive circuits 106A and 106B also impart considerable cross-talk to the photoelectric conversion film 122, and this lowers S/N ratio of the signals detected from the photoelectric conversion film 122, resulting in the problem of inferior quality of the image signal.

SUMMARY OF THE INVENTION

In view of the foregoing, it is an object of the present invention to provide a photoelectric conversion device and an image pickup device which use field emission devices, capable of greatly reducing delay in drive signals supplied to field emission devices, and cross-talk and the like that originate in these drive signals.

According to one aspect of the present invention, there is provided a photoelectric conversion device using electron emission devices. The photoelectric conversion device comprises a photoelectric conversion film for receiving incident light on one side thereof; a field emission layer having an electron emitting surface apart from and facing the other side of the photoelectric conversion film, and including a plurality of electron emission devices; and a drive layer formed on a back side of the field emission layer and including a plurality of device drive circuits for supplying drive signals to each of back electrodes of the plurality of electron emission devices.

According to another aspect of the present invention, there is provided an image pickup device. The image pickup device comprises the photoelectric conversion device; and an output circuit for extracting image signals from the photoelectric conversion film of the photoelectric conversion device and supplying the image signals.

Further features of the invention, its nature and various advantages will be more apparent from the accompanying drawings and the following detailed description of the preferred embodiments.

DETAILED DESCRIPTION OF THE INVENTION

Various exemplary embodiments of the present invention will now be described.

Figure 1:
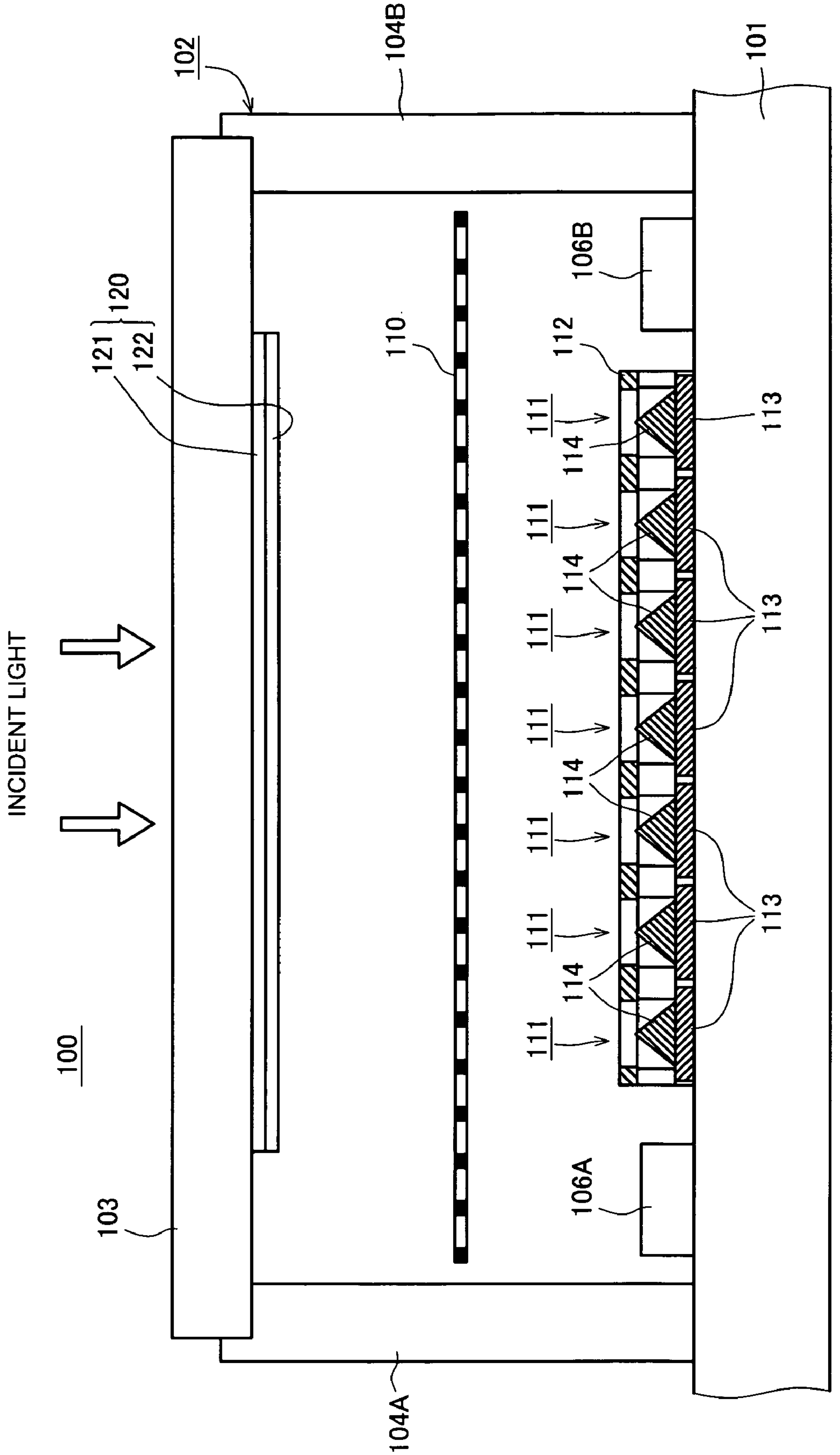
FIG. 1 is a cross section schematically illustrating a structure of the image pickup device disclosed in Japanese Patent Kokai No. 2000-48743.
Figure 2:
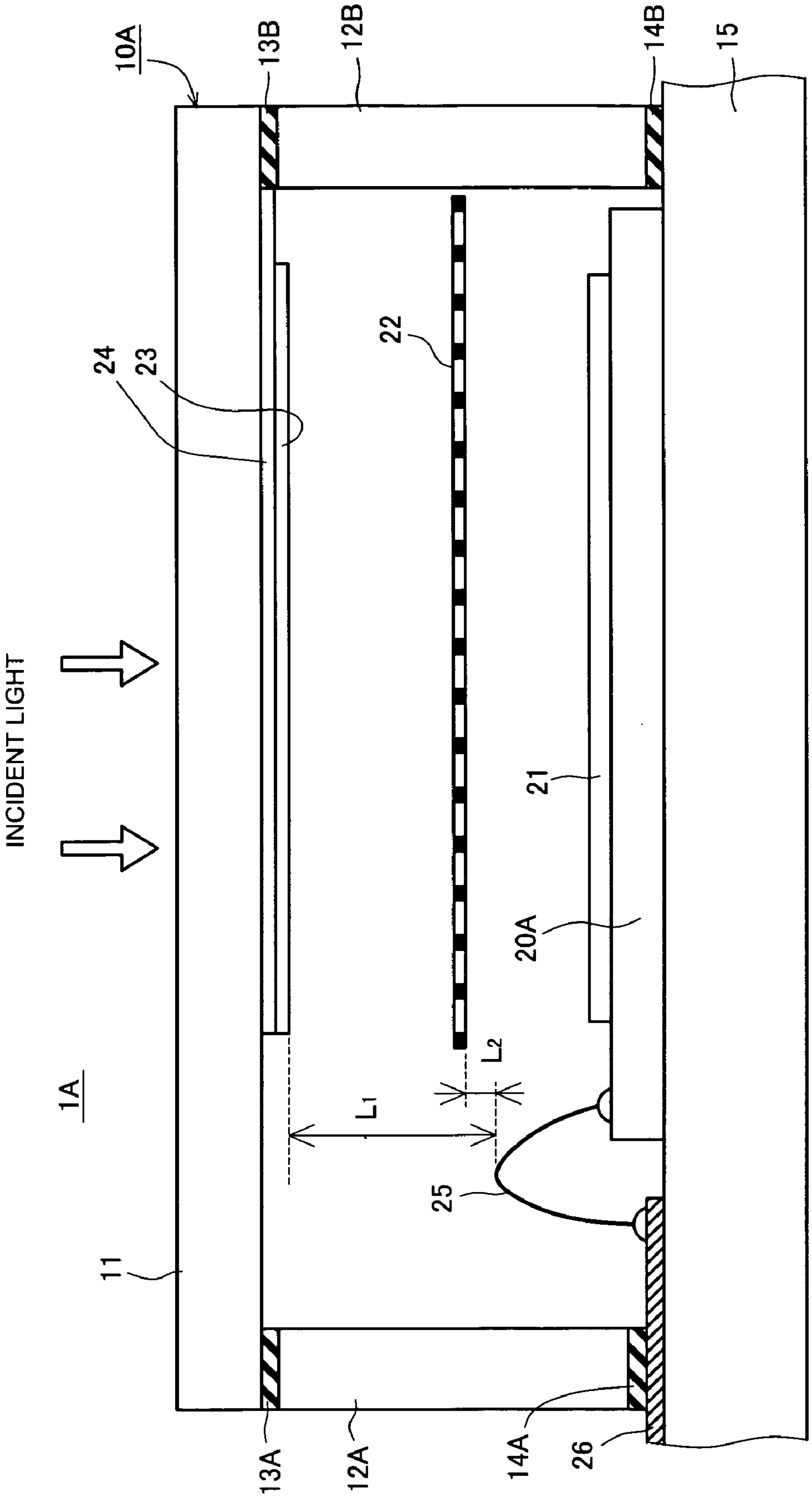
FIG. 2 is a cross section schematically illustrating a structure of the image pickup device (photoelectric conversion device) 1A which is an embodiment of the present invention.
Figure 3:
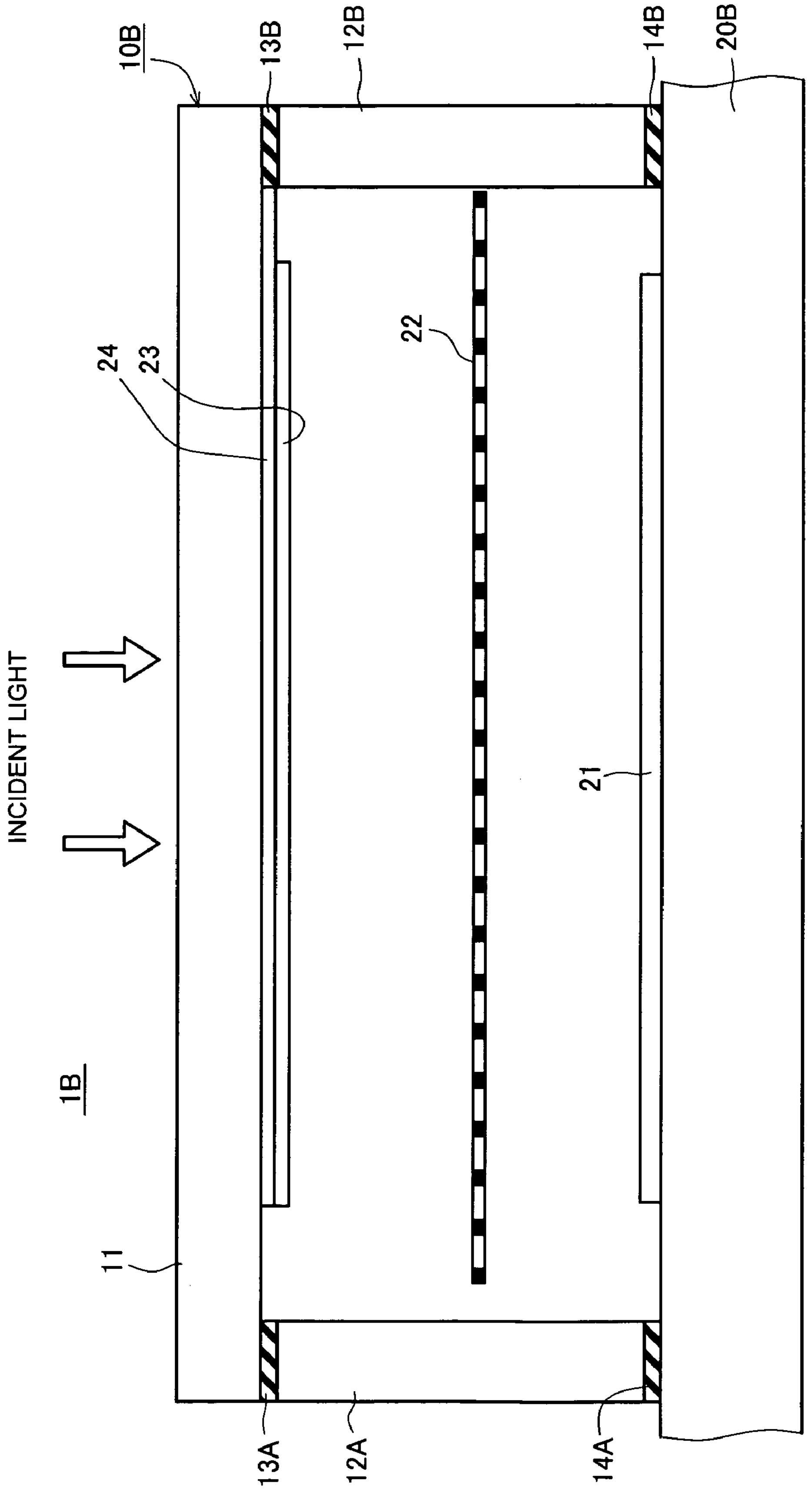
FIG. 3 is a cross section schematically illustrating a structure of the image pickup device (photoelectric conversion device) which is another embodiment of the present invention.

FIG. 2 is a cross section schematically illustrating a structure of the image pickup device (photoelectric conversion device) which is an embodiment of the present invention, and FIG. 3 is a cross section schematically illustrating a structure of the image pickup device (photoelectric conversion device) which is another embodiment of the present invention. The image pickup device 1A shown in FIG. 2 makes use of a single-crystal silicon substrate (device substrate) 20A, while the image pickup device 1B shown in FIG. 3 makes use of a glass substrate (device substrate) 20B.

As shown in FIG. 2, the image pickup device 1A using the single-crystal silicon substrate 20A includes a vacuum vessel 10A consisting mainly of a base material 15; a transparent substrate 11; spacers 12A and 12B; and sealing members 13A, 13B, 14A, and 14B. The interior of the vacuum vessel 10A is substantially a vacuum. A glass substrate that transmits visible light, a sapphire, quartz or other substrate that transmits ultraviolet rays, or a substrate that transmits X-rays can be used as the transparent substrate 11. The spacers 12A and 12B are made of an insulating material such as glass or ceramic. The sealing members 13A and 13B are provided between the transparent substrate 11 and the spacers 12A and 12B, while the sealing members 14A and 14B are provided between the base member 15 and the spacers 12A and 12B.

A transparent conductive film 24 of $SnO_2$, ITO, or the like is formed on the back side of the transparent substrate 11 by vacuum vapor deposition, sputtering, or another such method. A photoelectric conversion film 23 is formed on the back side of the transparent conductive film 24 by vacuum vapor deposition or any other such method. The photoelectric conversion film 23 and the transparent conductive film 24 constitute a photoelectric conversion target. An avalanche multiplication material whose main component is amorphous selenium, for example, is preferably used as the material of the photoelectric conversion film 23. When a strong electric field is applied to the photoelectric conversion film 23 composed of an avalanche multiplication material, an avalanche phenomenon occurs in which incident light generates electron-hole pairs within the film, and the generated holes are multiplied.

The single-crystal silicon substrate 20A is disposed on a surface of the base member 15, a drive layer (not shown; described below) is formed on this single-crystal silicon substrate 20A, and a field emission layer 21 is formed on the drive layer. A lead pin 26 is connected to an external circuit (not shown), and an electrode terminal electrically connected to the drive layer is provided to the end of the single-crystal silicon substrate 20A. A bonding wire 25 electrically connects the electrode terminal and the lead pin 26, and is made of gold (Au), aluminum (Al), or the like. The field emission layer 21 and the photoelectric conversion film 23 face each other, separated by a distance of about 2 mm. A mesh electrode 22 for removing excess electrons emitted from the field emission layer 21 is disposed between the field emission layer 21 and the photoelectric conversion film 23.

As shown in FIG. 2, the bonding wire 25 is provided in an arc shape. Since a relatively strong electric field is applied to the photoelectric conversion film 23 and the mesh electrode 22, discharge will tend to occur if the bonding wire 25 and the mesh electrode 22, or the bonding wire 25 and the photoelectric conversion film 23 are too close together. To avoid this, the closest portion of the bonding wire 25 to the mesh electrode 22 or the photoelectric conversion film 23 is preferably disposed at a location where no discharge between the closest portion and each of the mesh electrode 22 and the photoelectric conversion film 23 occurs. In other words, the shortest distance between the bonding wire 25 and the mesh electrode 22 or the photoelectric conversion film 23 is preferably maintained at a distance that will cause no discharge. The shortest distance between the bonding wire 25 and the mesh electrode 22 or the photoelectric conversion film 23 can vary with the applied voltage and the degree of vacuum. In terms of effectively avoiding discharge, particularly when the mesh electrode 22 or the photoelectric conversion film 23 is disposed up to a region covering the distal end of the bonding wire 25, it is preferable for the vertical distance $L_2$ or $L_1$ between the distal end of the bonding wire 25 and the mesh electrode 22 or the photoelectric conversion film 23 to be at least 0.1 mm, and particularly at least 0.5 mm.

Meanwhile, as shown in FIG. 3, in the case of the image pickup device 1B that makes use of the glass substrate 20B, a wiring pattern and electrode pattern are formed by a known thin-film formation process on the glass substrate 20B. A vacuum vessel 10B consists mainly of the glass substrate 20B, the spacers 12A and 12B, the transparent substrate 11, and the sealing members 13A, 13B, 14A, and 14B. A drive layer (not shown) and the field emission layer 21 are formed in this order on the glass substrate 20B in the interior of the vacuum vessel 10B, and the transparent conductive film 24, photoelectric conversion film 23, and mesh electrode 22 are disposed in the same manner as in the image pickup device 1A described above.

Figure 4:
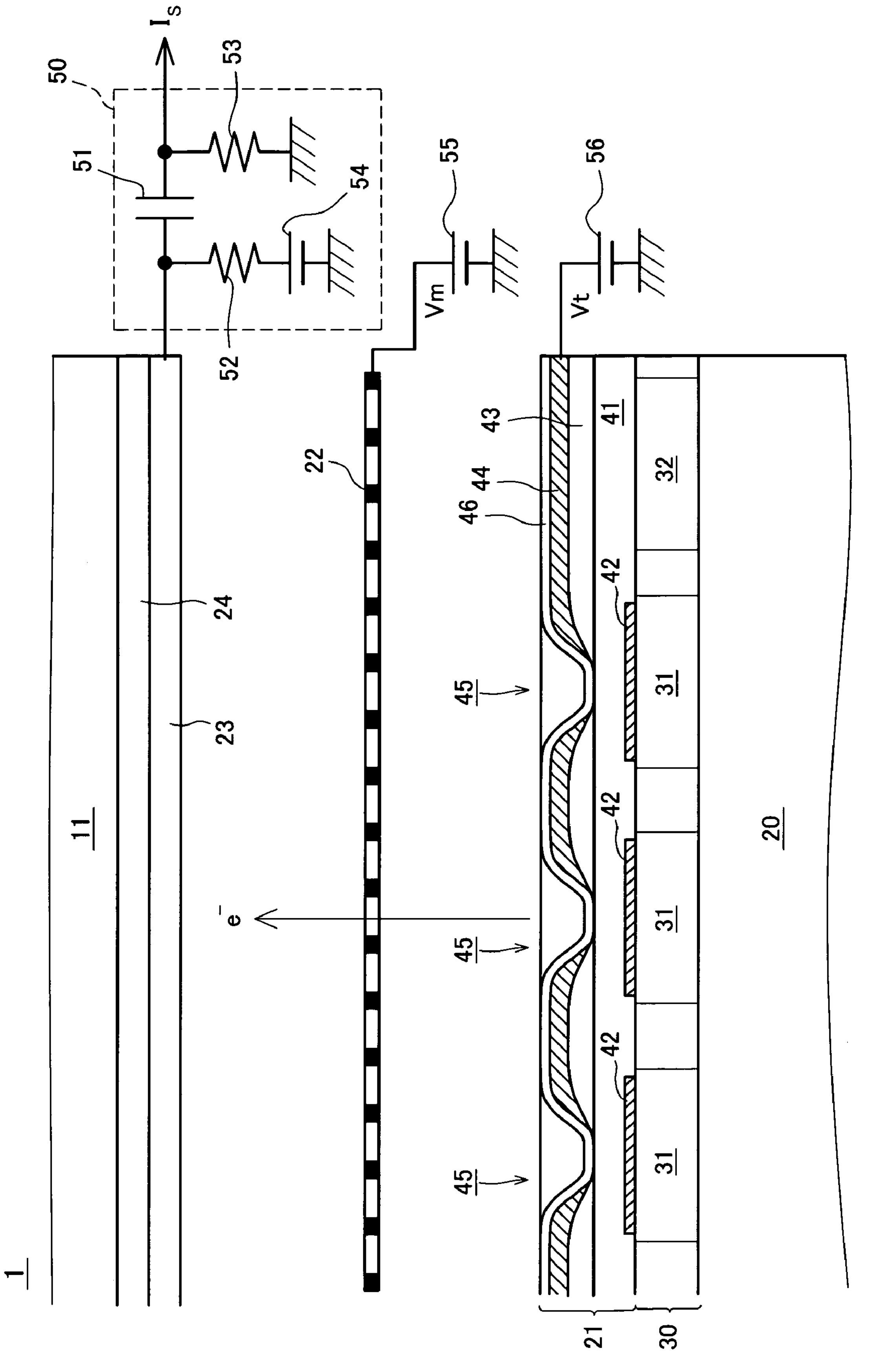
FIG. 4 is a cross section schematically illustrating main components of the image pickup device.

FIG. 4 is a cross section schematically illustrating main components of the image pickup devices 1A and 1B shown in FIGS. 2 and 3. The device substrate 20 here represents either the single-crystal silicon substrate 20A or the glass substrate 20B described above. The image pickup device 1A shown in FIG. 4 has an output circuit 50 which extracts an image signal $I_s$ from the photoelectric conversion film 23 and outputs this signal. The output circuit 50 includes a capacitor 51, a first resistor 52, a second resistor 53, and a power supply 54. In this output circuit 50, the signal extracted from the photoelectric conversion film 23 is supplied through the capacitor 51 to the outside as the image signal $I_s$. One terminal of the capacitor 51 is connected through the first resistor 52 to the power supply 54, while the other terminal of the capacitor 51 is connected to the second resistor 53.

The field emission layer 21 has an electron emission surface facing and apart from the back side of the photoelectric conversion film 23, and has a plurality of electron emission devices 45 that emit electron beams toward the mesh electrode 22 and the photoelectric conversion film 23. These electron emission devices 45 are arranged along a main side of the device substrate 20, and form the electron emission surface. A high voltage of approximately 800 V is applied to the photoelectric conversion film 23, incident light on this photoelectric conversion film 23 generates electron-hole pairs, and the generated holes are multiplied by an avalanche multiplication process. A positive target voltage is applied to the transparent conductive film 24, a voltage $V_m$ of approximately 500 V is applied to the mesh electrode 22, and a voltage $V_t$ of approximately 22 V is applied to an upper electrode layer 44. The electrons $e^-$ emitted from the electron emission devices 45 are accelerated by the electric field between the mesh electrode 22 and the upper electrode layer 44, and by the electric field between the mesh electrode 22 and the transparent conductive film 24, then pass through the holes in the mesh electrode 22 and reach the photoelectric conversion film 23. At the photoelectric conversion film 23, the multiplied holes and the electrons that have arrived from the electron emission devices 45 recombine and are annihilated. Therefore, the amount of charge accumulated by the capacitor 51 varies with the amount of incident light on the photoelectric conversion film 23.

Figure 5:
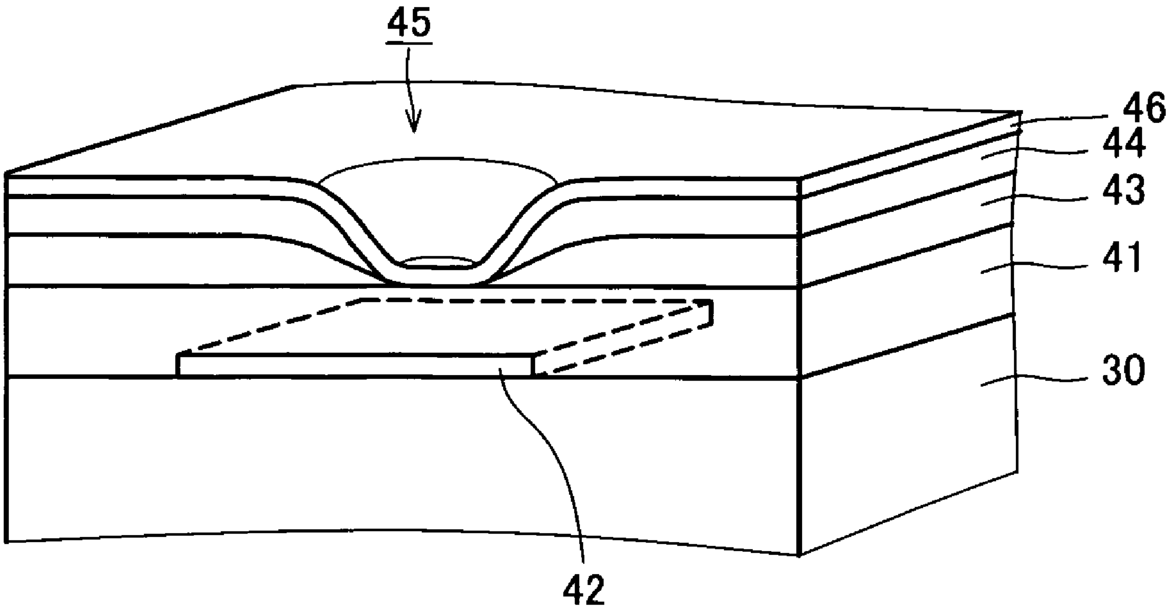
FIG. 5 is a perspective view schematically illustrating a structure of an electron emission device.

FIG. 5 is a perspective view schematically illustrating a structure of an electron emission device 45. This electron emission device 45 is structured the same as the High Efficiency electron Emission device (HEED) disclosed in Japanese Patent Kokai No. 2001-196017. Specifically, a lower electrode layer 42 composed of aluminum (Al), tungsten (W), titanium nitride (TiN), copper (Cu), chromium (Cr), or the like is formed by sputtering or any other such process on a drive layer 30. An electron supply layer 41 composed of amorphous silicon or the like, and an insulating film 43 composed of silicon oxide or the like are formed in this order on the lower electrode layer 42. An upper electrode layer (metal thin-film electrode) 44 composed of tungsten (W), platinum (Pt), gold (Au), or the like and a carbon film 46 are formed continuously on the insulating film 43 over an area covering at least all of the device drive circuits 31. The insulating film 43 is a dielectric, and except for the electron emission region, has a relatively large thickness of at least 50 nm. As shown in FIG. 5, in each of the electron emission devices 45, the upper electrode layer 44 and the insulating film 43 have thicknesses that gradually decrease toward the center of the electron emission region. A region in which the thickness of the upper electrode layer 44 and the insulating film 43 reaches zero is formed in the center of the electron emission region. As a result, the electron emission region has a surface shape in which the portion near the center is recessed. Also, the carbon film 46 is formed on the entire electron emission surface by sputtering or any other such process in a thickness of at least several dozen nanometers so as to cover the entire electron emission region and the upper electrode layer 44. The carbon film 46 functions both as an electrode layer and as a protective film for the electron emission region.

In the structure described above, when a potential difference is imparted between the upper electrode layer 44 and the lower electrode layer 42, a electric field is formed that increases in intensity toward the center of the electron emission region. The electrons injected into the electron supply layer 41 from the lower electrode layer 42 are supplied to the insulating film 43 near the center of the electron emission region, and are accelerated by the strong electric field. This strong electric field is believed to cause the electrons to tunnel through the upper electrode layer 44 and the carbon film 46 and to emit into a vacuum space.

Amorphous silicon (a-Si) is preferable as a material for the electron supply layer 41. Hydrogenated amorphous silicon (a-Si:H) in which dangling bonds of a-Si are terminated with hydrogen atoms (H), hydrogenated amorphous silicon carbide (a-SiC:H) in which some of silicon atoms are replaced with carbon atoms (C), hydrogenated amorphous silicon nitride (a-SiN:H) in which some of silicon atoms are replaced with nitrogen atoms (N), or other such compound semiconductors may be used instead of the amorphous silicon. Silicon doped with boron, gallium, phosphorus, indium, arsenic, or antimony may be used of the amorphous silicon.

The above-mentioned high-efficiency electron emission device is used as a preferable field emission device in this example, no limitation thereto in the present invention. A field emission device including carbon nanotubes as the field emission material of the emitter may be used instead of the above-mentioned high-efficiency electron emission device.

Next, referring to FIG. 4, the drive layer 30 includes the device drive circuits 31 which are in contact with the back side of the field emission layer 21 and supply drive signals to the lower electrode layer (back side electrode) 42 of each of the plurality of electron emission devices 45. The device drive circuits 31 are electrically insulated from one another. The drive layer 30 further includes a peripheral drive circuit 32 for supplying control signals to the device drive circuits 31.

Figure 6:
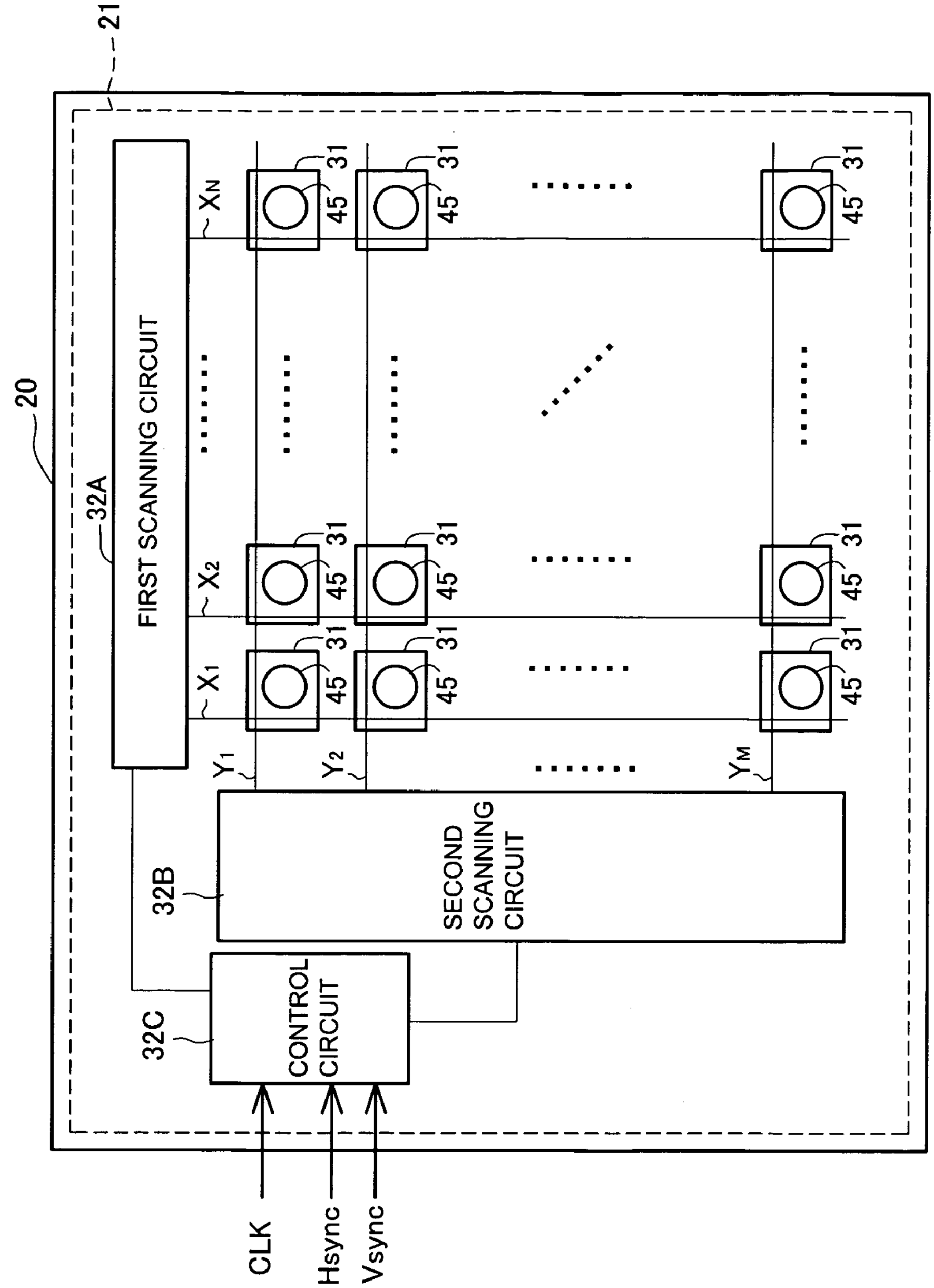
FIG. 6 is a plan view schematically illustrating a drive layer of the image pickup device shown in FIG. 4.

FIG. 6 is a plan view schematically illustrating a drive layer 30 of the image pickup device 1 shown in FIG. 4. The device drive circuits 31 correspond to the respective electron emission devices 45, and are arranged in a matrix in the X direction and the perpendicular Y direction. Along with the device drive circuits 31, a first scanning circuit 32A, a second scanning circuit 32B, and a control circuit 32C are formed on the device substrate 20. These scanning circuits 32A and 32B and the control circuit 32C are a circuit group constituting the peripheral drive circuit 32 shown in FIG. 4. The control circuit 32C, for example, produces control signals on the basis of a clock signal CLK, a vertical synchronization signal Vsync, and a horizontal synchronization signal Hsync which are inputted from an outside source through the bonding wire 25 (FIG. 2), and supplies these signals to the scanning circuits 32A and 32B. As a result, the scanning circuits 32A and 32B generate scanning pulses such that the electron emission devices 45 are sequentially driven in the X and Y directions.

As shown in FIGS. 6 and 4, the entire drive layer 30 is covered with the field emission layer 21 including the upper electrode layer 44 and the carbon film 46, the field emission layer 21 being interposed between the photoelectric conversion film 23 and the drive layer 30 including the first scanning circuit 32A, the second scanning circuit 32B, and the control circuit 32C. In the present invention, it is preferable for all of the device drive circuits 31, the control circuit 32C, and the scanning circuits 32A and 32B to be covered by the field emission layer 21, but the control circuit 32C and the scanning circuits 32A and 32B may instead be disposed in a region not covered by the field emission layer 21. Also, the control circuit 32C may be disposed outside of the device substrate 20, instead of being formed over the device substrate 20.

The first scanning circuit 32A generates scanning pulses which are applied to N number (where N is an integer of 2 or greater) of scanning lines $X_1, X_2, \ldots, X_N$ arranged at a specific spacing in the X direction. The second scanning circuit 32B generates scanning pulses which are applied to M number (where M is an integer of 2 or greater) of scanning lines $Y_1, Y_2, \ldots, Y_M$ arranged at a specific spacing in the Y direction. The device drive circuits 31 are formed at the points of intersection of the X direction scanning lines $X_1$ to $X_N$ and the Y direction scanning lines $Y_1$ to $Y_M$. Of these scanning lines $X_1$ to $X_N$ and $Y_1$ to $Y_M$, the device drive circuit 31 located at the intersection of the two scanning lines $X_P$ and $Y_Q$ (P is 1 to N, and Q is 1 to M) to which scanning pulses are simultaneously applied is selected. The electron emission device 45 is driven by this selected device drive circuit 31. Specifically, when the second scanning circuit 32B applies a scanning pulse to the first scanning line $Y_1$, the first scanning circuit 32A sequentially applies scanning pulses to the scanning lines $X_1$ to $X_N$, and then when the second scanning circuit 32B applies a scanning pulse to the second scanning line $Y_2$, the first scanning circuit 32A sequentially applies scanning pulses to the scanning lines $X_1$ to $X_N$. In this way, the scanning circuits 32A and 32B sequentially select the Y direction scanning line $Y_Q$ (Q is 1 to M) one at a time, and sequentially apply scanning pulses to the X direction scanning line $X_P$ (P is 1 to N) when a scanning pulse is applied to the selected scanning line $Y_Q$, thereby selecting the device drive circuits 31 in a dot sequential manner.

Figure 7:
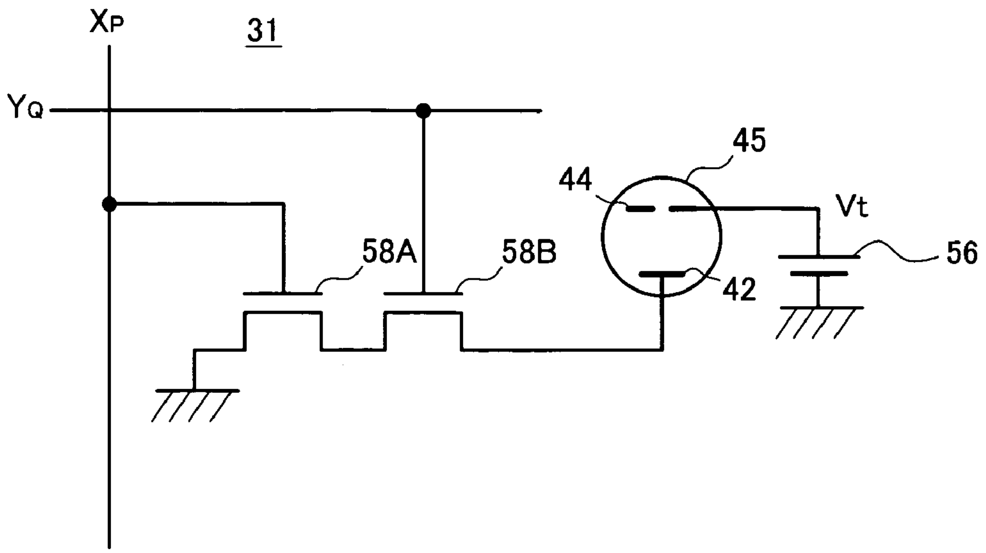
FIG. 7 illustrates an example of an equivalent circuit of a device drive circuit.

FIG. 7 illustrates an example of an equivalent circuit of the device drive circuit 31. This device drive circuit 31 includes a selection transistor 58A and a drive transistor 58B. In the selection transistor 58A, the gate is wired to an X direction scanning line $X_P$, the source is grounded, and the drain is wired to a source electrode of the drive transistor 58B. In the drive transistor 58B, the gate is wired to a Y direction scanning line $Y_Q$, and the drain is wired to the back electrode 42 of the electron emission device 45. When high-level scanning pulses are simultaneously applied to the scanning line $X_P$ and the scanning line $Y_Q$, the selection transistor 58A and the drive transistor 58B are switched ON, and the potential of the back electrode 42 of the electron emission device 45 goes to zero volts. At this point the potential difference $V_t$ is generated between the upper electrode layer 44 and the back electrode 42, causing the electron emission device 45 to emit an electron beam.

Figure 8:
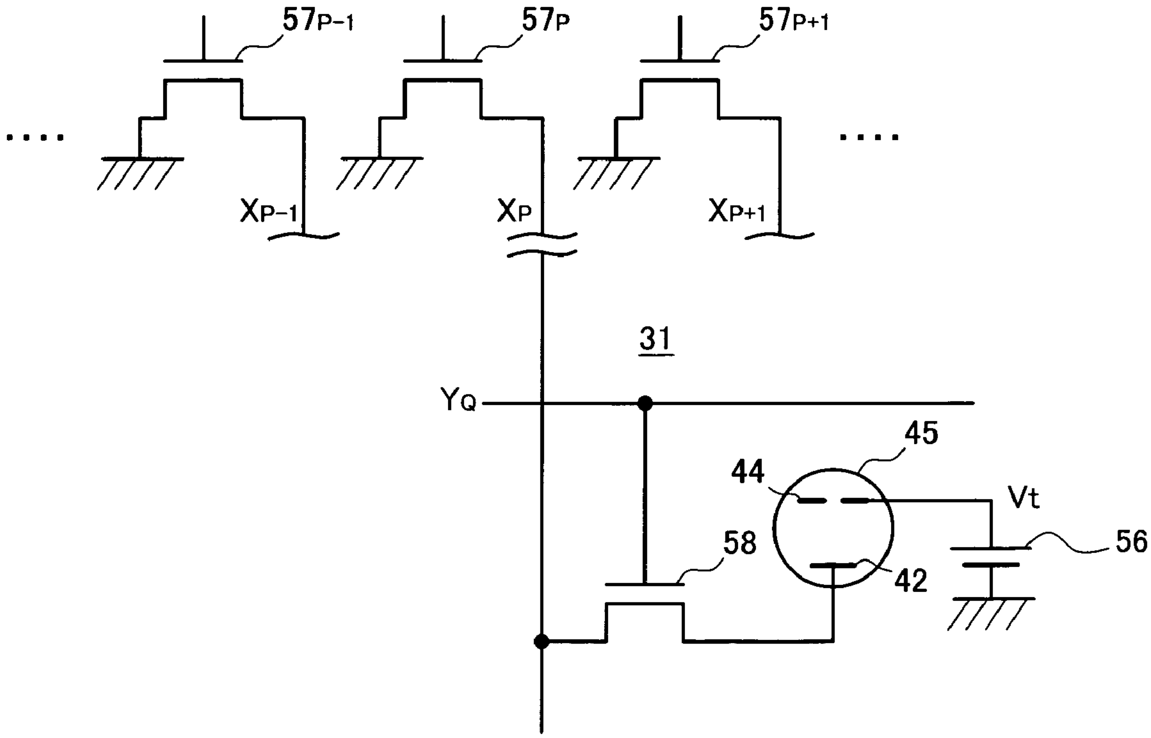
FIG. 8 illustrates another example of an equivalent circuit of a device drive circuit.

The device drive circuits 31 may also be constituted as the equivalent circuit shown in FIG. 8. In the drive transistor 58, the source is wired to an X direction scanning line $X_P$, the gate is wired to a Y direction scanning line $Y_Q$, and the drain is wired to the back electrode 42 of an electron emission device 45. The first scanning circuit 32A includes a selection transistor $\mathbf{57}_P$ that connects with an X direction scanning line $X_P$. When voltage is applied to the gate to switch the selection transistor $\mathbf{57}_P$ ON, and a high-level scanning pulse is applied to a scanning line $Y_Q$ to switch the drive transistor 58 ON, conduction between the drain and source of the selection transistor $\mathbf{57}_P$ results in the grounding of the scanning line $X_P$. At the same time, the scanning line $X_P$ becomes electrically connected with the back electrode 42 through the drive transistor 58, and the potential difference $V_t$ is generated between the upper electrode layer 44 and the back electrode 42, causing the electron emission device 45 to emit an electron beam. The device drive circuits 31 formed on the above-mentioned drive layer 30 are not limited to the above constitution.

Figure 9:
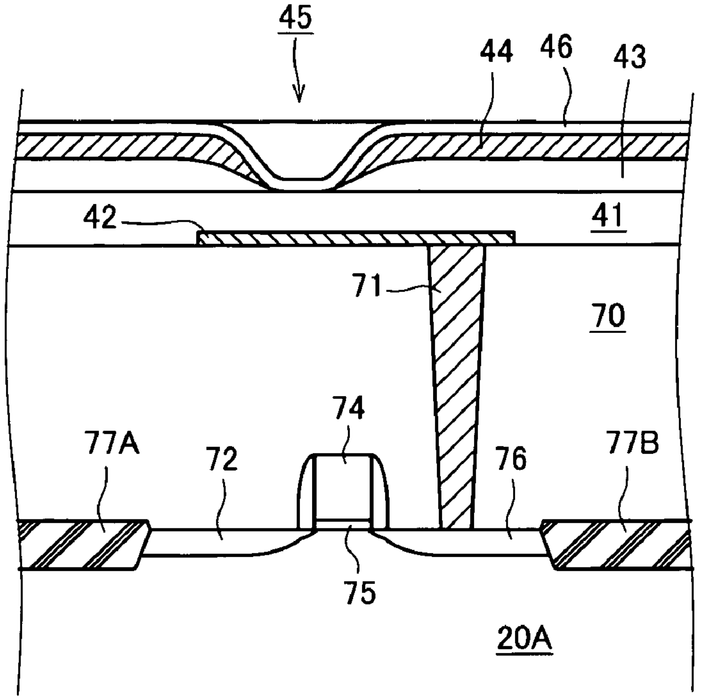
FIG. 9 is a cross section schematically illustrating an example of the device drive circuit formed on a single-crystal silicon substrate.

FIG. 9 is a cross section schematically illustrating an example of the device drive circuit formed on the single-crystal silicon substrate 20A. A MOSFET (MOS field effect transistor) is formed on the single-crystal silicon substrate 20A. In the MOSFET, device separating films 77A and 77B are formed in the single-crystal silicon substrate 20A, and a gate insulating film 75 and a gate electrode 74 composed of polysilicon are formed on the single-crystal silicon substrate 20A between these device separating films 77A and 77B by known photolithographic and etching techniques. Additionally, impurities are introduced into the single-crystal silicon substrate 20A using the gate electrode 74 and the device separating films 77A and 77B as masks. A source region (source electrode) 72 and a drain region (drain electrode) 76 are formed and are self-aligned by activating the impurities. The lower electrode layer 42 is electrically connected with the drain region 76 via tungsten or another such metal inside a contact hole 71 that passes through an interlayer insulating film 70. A transistor with a bipolar structure may be used instead of the MOSFET shown in FIG. 9.

Figure 10:
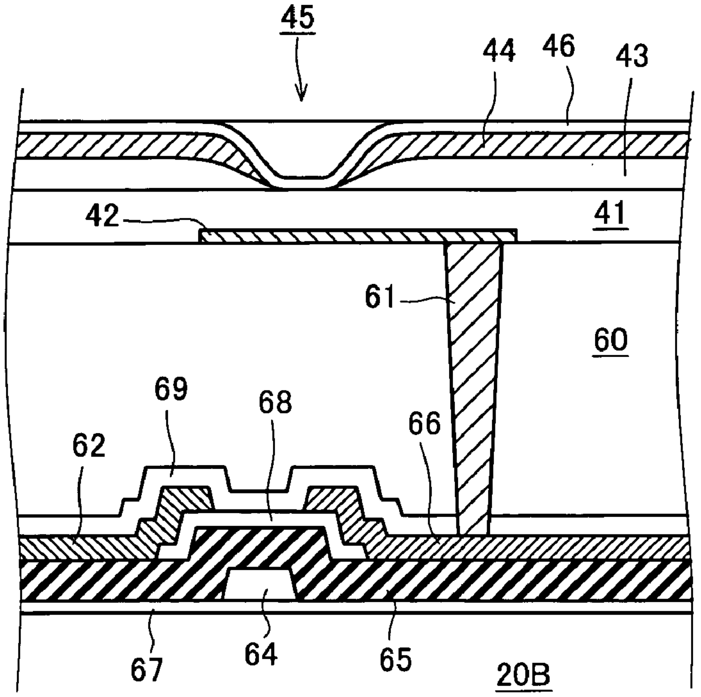
FIG. 10 is a cross section schematically illustrating an example of the device drive circuit formed on a glass substrate.

On the other hand, FIG. 10 is a cross section schematically illustrating an example of the device drive circuit formed on a glass substrate 20B, and shows a cross section of a TFT (thin film transistor) with a bottom gate structure. An undercoat layer 67 composed of silicon oxide or the like is formed on the glass substrate 20B, and a gate electrode 64 composed of polysilicon or the like is formed over this undercoat layer 67. A gate insulating film 65 composed of silicon nitride or the like is deposited so as to cover the gate electrode 64, and an amorphous silicon film 68 is formed over this gate insulating film 65. A source electrode 62 and a drain electrode 66 are formed facing each other on the amorphous silicon film 68. A TFT is then formed by successively depositing a protective film 69 composed of silicon nitride or the like, and an insulating film 60. The lower electrode layer 42 is electrically connected with the drain electrode 66 via aluminum or another such metal inside a contact hole 61 that passes through the protective film 60 and the insulating film 69. A TFT with a top gate structure may be employed instead of the TFT with the bottom gate structure shown in FIG. 10.

Figure 11:
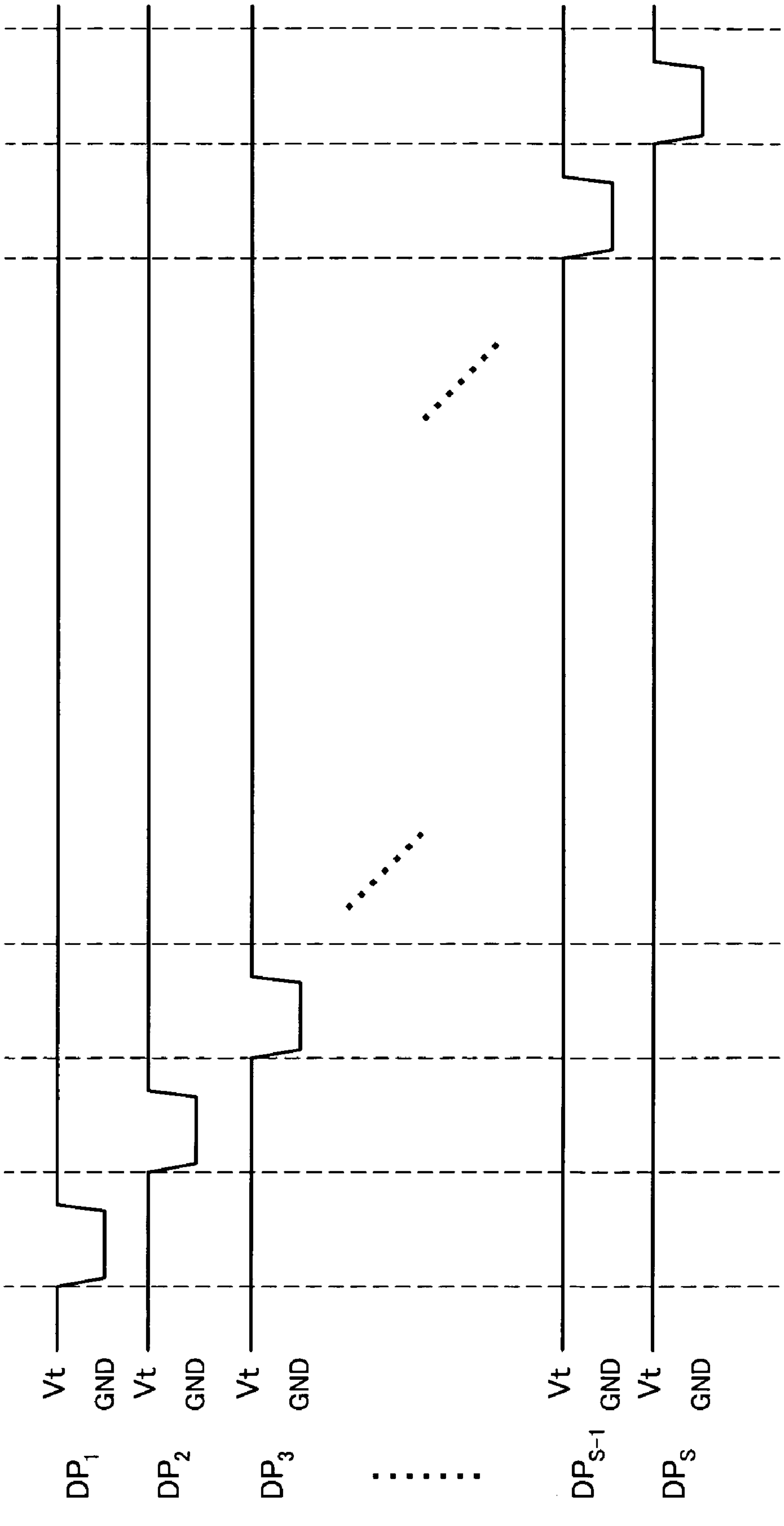
FIG. 11 is a timing chart schematically illustrating waveforms of drive signals applied to electron emission devices.

The electron emission devices 45 are sequentially driven for each of the intersections of the scanning lines $X_1$ to $X_N$ and $Y_1$ to $Y_M$. This means that electron emission devices 45 at two mutually different points of intersection are not driven at the same time, but rather that the electron emission devices 45 are driven one after the other for each pixel. FIG. 11 is a timing chart schematically illustrating waveforms of drive signals $DP_1, DP_2, \ldots, DP_S$ (where S is the total number of electron emission devices 45; S=N×M) applied to the back electrodes 42 of the electron emission devices 45. The drive signals $DP_1, DP_2, \ldots, DP_S$ are at substantially the same level as the potential $V_t$ of the upper electrode layer 44 when the field emission devices are not being driven, and is maintained at zero volts (GND) during drive. As mentioned above, in the case of VGA specification, the drive period for each field emission device is approximately 100 nanoseconds.

In this example, to simplify the description, the device drive circuits 31 are provided to each of the electron emission devices 45, but instead thereof display cells each having a specific number of electron emission devices 45 as a unit may be defined, a common back electrode may be formed for each display cell, and a device drive circuit 31 may be provided for each display cell. In this case, a single device drive circuit 31 may supply a common drive signal to a back electrode of a plurality of electron emission devices 45 included in a single display cell. The electron emission devices 45 may be driven in a dot sequential manner for each display cell.

As described above, according to the image pickup devices 1A and 1B of the above embodiments, the field emission layer 21 entirely covers the peripheral drive circuit 32, the device drive circuits 31, and the scanning lines $X_1$ to $X_N$ and $Y_1$ to $Y_M$, so it is possible to minimize the effect of cross-talk in the photoelectric conversion film 23 due to the drive signals, thereby to improve S/N ratio and to obtain an image signal of high quality. Additionally, since the electron emission devices 45 are driven as active devices in a dot sequential manner by the device drive circuits 31, delays in the drive signal can be minimized even when the drive time is extremely short.

Furthermore, high-efficiency field emission devices having the structure shown in FIG. 5 are used in the above embodiments, and therefore the electron emission devices 45 can be driven at a lower voltage than conventional Spindt-type field emission devices. Thus, the rise and fall times of the pulses of the drive signals are shorter, so dot-sequential drive can be performed at higher speed by supplying drive signals of shorter pulse width to the electron emission devices 45.

Finally, in the above embodiments the upper electrode layer 44 is also formed in the region covering the peripheral drive circuit 32, but instead the upper electrode layer 44 may be formed in the region covering only the device drive circuits 31 and the scanning lines $X_1$ to $X_N$ and $Y_1$ to $Y_M$. Once again this makes possible a reduction in the above-mentioned cross-talk and an improvement in S/N ratio.

It is understood that the foregoing description and accompanying drawings set forth the preferred embodiments of the invention at the present time. Various modifications, additions, and alternatives will, of course, become apparent to those skilled in the art in light of the foregoing teachings without departing from the sprit and scope of the disclosed invention. Thus, it should be appreciated that the invention is not limited to the disclosed embodiments but may be practiced within the full scope of the appended claims.

This application is based on Japanese Patent Application No. 2004-034942 which is hereby incorporated by reference.

What is claimed is:

1. A photoelectric conversion device using electron emission devices, comprising:

a photoelectric conversion film for receiving incident light on one side thereof;

a field emission layer including electron emission devices which have respective electron emitting regions apart from and facing the other side of the photoelectric conversion film;

a drive layer formed on a back side of the field emission layer and including a plurality of device drive circuits; and first and second scanning circuits for providing scanning pulses to the device drive circuits so as to select the device drive circuits in a sequential manner, wherein each of the electron emission devices includes:

a back electrode connected to the corresponding device drive circuit;

an electron supply layer composed of a semiconductor and formed on the back electrode;

an insulating film formed over the electron supply layer; and an electrode layer formed over the insulating film and connected to a voltage source that applies a constant-voltage to the electrode layer, and wherein each of the selected drive circuits supplies a drive pulse to the corresponding back electrode of one or more of the electron emission devices in response to the scanning pulses provided by the first and second scanning circuits.

2. The photoelectric conversion device according to claim 1, wherein each of the electron emission devices emits an electron beam in response to a difference in potential between the electrode layer and the back electrode thereof.

3. The photoelectric conversion device according to claim 2, wherein thicknesses of the insulating film and the electrode layer gradually decrease toward each of electron emitting regions.

4. The photoelectric conversion device according to claim 1, wherein each of the plurality of device drive circuits is Conned for each display cell having one or more of the electron emission devices as a unit.

5. The photoelectric conversion device according to claim 1, wherein each of the plurality of device drive circuits includes an active device for supplying the drivepulse.

6. The photoelectric conversion device according to claim 5, wherein the drive layer further includes a peripheral drive circuit having the first and second scanning circuits for supplying control signals of the scanning pulses to the active devices.

7. The photoelectric conversion device according to claim 1, wherein the drive layer is formed on a single-crystal substrate.

8. The photoelectric conversion device according to claim 7, further comprising a bonding wire for electrically connecting an electrode terminal provided on the single-crystal substrate to an outside source, wherein a closest portion of the bonding wire to the photoelectric conversion film is disposed at a location where no discharge between said closest portion and the photoelectric conversion film occurs.

9. The photoelectric conversion device according to claim 8, wherein the bonding wire is disposed in an arc shape, and a distance between a distal end of the bonding wire and a back side of the photoelectric conversion film, in a direction perpendicular to said back side, is set to a specific gap so that no discharge occurs.

10. The photoelectric Conversion device according to claim 7, further comprising:

a mesh electrode disposed between the photoelectric conversion film and the electron emission devices, for removing excess electrons emitted from the electron emission devices; and a bonding wire for electrically connecting an electrode terminal provided on the single-crystal substrate to an outside source, wherein a closest portion of the bonding wire to the mesh electrode is disposed at a location where no discharge between said closest portion and the mesh electrode occurs.

11. The photoelectric conversion device according to claim 10, wherein the bonding wire is disposed in an arc shape, end a distance between a distal end of the bonding wire and a back side of the mesh electrode, in a direction perpendicular to said back side, is set to a specific gap so that no discharge occurs.

12. The photoelectric conversion device according to claim 1, wherein the drive layer is formed on a glass substrate.

13. The photoelectric conversion device according to claim 1, wherein said electrode layer formed over said insulating film comprises an electromagnetic or electrostatic shield placed between said photoelectric conversion film and said back electrode.

14. The photoelectric conversion device according to claim 1, wherein all of the electrode layers of said electron emission devices are supplied with the constant-voltage by said voltage source.

15. The photoelectric conversion device according to claim 14, wherein all of the electrode layers of said electron emission devices are continuously formed as a single electrode layer.

16. An image pickup device comprising:

a photoelectric conversion device including:

a photoelectric conversion film for receiving incident light on one side thereof;

a field emission layer including electron emission devices which have respective election emitting regions apart from and facing the other side of the photoelectric conversion film;

a drive layer formed on a back side of the field emission layer and including a plurality of device drive circuits; and first and second scanning circuits for providing scanning pulses to the device drive circuits so as to select the device drive circuits in a sequential manner; and an output circuit for extracting image signals from the photoelectric conversion film and outputting the image signals, wherein each of the electron emission devices includes:

a back electrode connected to the corresponding device drive circuit;

an electron supply layer composed of a semiconductor and toned on the back electrode;

an insulating film formed over the electron supply layer; and an electrode layer formed over the insulating film and connected to a voltage source that applies a constant-voltage to the electrode layer, and wherein each of the selected drive circuits supplies a drive pulse to the corresponding back electrode of one or more of the electron emission devices in response to the scanning pulses provided by the first and second scanning circuits.

17. The image pickup device according to claim 16, wherein said electrode layer formed over said insulating film comprises an electromagnetic or electrostatic shield placed between said photoelectric conversion film and said back electrode.

18. The image pickup device according to claim 16, wherein all of the electrode layers of said electron emission devices are supplied with the constant-voltage by said voltage source.

19. The image pickup device according to claim 18, wherein all of the electrode layers of said electron emission devices are continuously formed as a single electrode layer.

* * * * *

UNITED STATES PATENT AND TRADEMARK OFFICE

CERTIFICATE OF CORRECTION

PATENT NO. : 7,348,531 B2 
APPLICATION NO. : 11/053202
DATED : March 25, 2008
INVENTOR(S) : Yoshiyuki Okuda et al.

It is certified that error appears in the above-identified patent and that said Letters Patent is hereby corrected as shown below:

It is requested that the word "TONED" be corrected to --FORMED-- in claim 16, on the eighth line of column 12, 3rd word.

Signed and Sealed this

Fifteenth Day of July, 2008

JON W. DUDAS
*Director of the United States Patent and Trademark Office*